US009923531B2

United States Patent

(12) Chueh

(10) Patent No.: US 9,923,531 B2

(45) Date of Patent: Mar. 20, 2018

(54) POWER PROCESSING CIRCUIT, TWO-PATH POWER PROCESSING CIRCUIT AND MULTIPLEX POWER PROCESSING CIRCUIT

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Yu-Chih Chueh, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 13 days.

(21) Appl. No.: 14/980,309

(22) Filed: Dec. 28, 2015

(65) Prior Publication Data

US 2016/0191004 A1 Jun. 30, 2016

(30) Foreign Application Priority Data

Dec. 30, 2014 (TW) ............................ 103146384 A

(51) Int. Cl.
*H01P 5/12* (2006.01)
*H03F 3/60* (2006.01)

(52) U.S. Cl.
CPC ............... *H03F 3/602* (2013.01); *H01P 5/12* (2013.01); *H03F 2200/451* (2013.01)

(58) Field of Classification Search
CPC ....... H03F 3/602; H03F 2200/451; H01P 5/12
USPC .......................................................... 333/128
See application file for complete search history.

(56) References Cited

U.S. PATENT DOCUMENTS 5,847,625 A 12/1998 Gillette

FOREIGN PATENT DOCUMENTS

| | | | |
|---|---|---|---|
| CN | 1249080 | A | 3/2000 |
| CN | 1495994 | A | 5/2004 |
| CN | 201174417 | Y | 12/2008 |
| CN | 201821426 | U | 5/2011 |
| CN | 102403563 | A | 4/2012 |
| CN | 102832434 | A | 12/2012 |
| TW | 201101573 | A1 | 1/2011 |
| TW | 201445802 | A | 12/2014 |

*Primary Examiner* — Robert Pascal
*Assistant Examiner* — Kimberly Glenn
(74) *Attorney, Agent, or Firm* — ScienBiziP, P.C.

(57) ABSTRACT

A power processing circuit includes a first portion, a second portion, a third portion, a resistor, a first coupling portion, a second coupling portion, a third coupling portion and a fourth coupling portion. The first portion, the second portion and the third portion are connected to respective external components. The first coupling portion and the third coupling portion are micro-strips symmetrical to the first portion. The second coupling portion and the fourth coupling portion are micro-strips symmetrically connected to two terminals of the resistor.

20 Claims, 13 Drawing Sheets

10

1 2 3 4 5 6 7 8 9 R

POWER PROCESSING CIRCUIT, TWO-PATH POWER PROCESSING CIRCUIT AND MULTIPLEX POWER PROCESSING CIRCUIT

FIELD

The disclosure relates to power processing circuits, and particularly to an amplification circuit consisted of power processing circuits printed on a base of a PCB.

BACKGROUND

In mobile communications, it is necessary to divide input powers proportionally for several output circuits. A power divider is often used to divide a single input power into two or more equal or unequal output powers. Meanwhile, the power divider is also used as a power combiner to combine several input powers into a single output power.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments.

DETAILED DESCRIPTION

Figure 1:
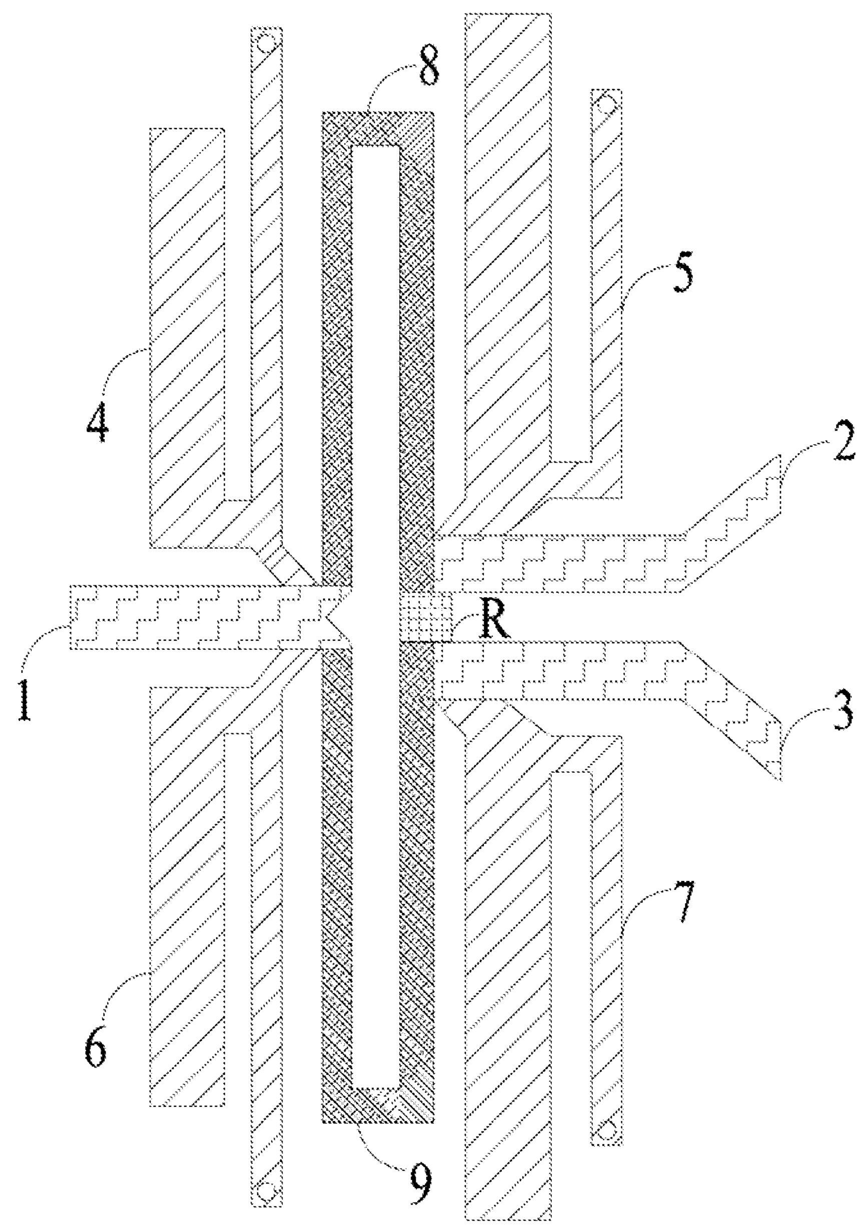
FIG. 1 is a diagrammatic view of one embodiment of a power processing circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising" when utilized, means "including, but not necessarily limited to", it specifically indicates open-ended inclusion or membership in the so-described combination, group, series and the like.

The present disclosure is described in relation to power processing circuits. It should be noted that different shadings of the following drawings are used to distinguish different parts of the structures of the embodiments in order to describe more clearly.

One embodiment of a power processing circuit is a circuit printed on a printed circuit board (PCB) to divide or combine powers of signals. One embodiment of a multiplex power processing circuit is a circuit printed on a PCB to enhance transmission power of signals.

FIG. 1 is a diagrammatic view of one embodiment of a power processing circuit 10.

The power processing circuit 10 includes a first portion 1, a second portion 2, a third portion 3, a first coupling portion 4, a second coupling portion 5, a third coupling portion 6, a fourth coupling portion 7 and a resistor R.

When the power processing circuit 10 is distributing powers, the power processing circuit 10 is dividing a single power into two power signals, the first portion 1 is a signal input terminal for inputting power signals, the second portion 2 and the third portion 3 are signal output terminals for outputting power signals.

When the power processing circuit 10 is combining powers, the power processing circuit 10 is combining two power signals into a single power, the first portion 1 is a signal output terminal for outputting power signals, the second portion 2 and the third portion 3 are signal input terminals for inputting power signals.

The resistor R is connected between the second portion 2 and the third portion 3 to isolate signals between the second portion 2 and the third portion 3 for decreasing signal interferences between the second portion 2 and the third portion 3. In at least one embodiment, a package of the resistor R can be 0402 type package, resistance of the resistor R can be 100 ohms.

The first coupling portion 4 is connected to the first portion 1 and a ground of the PCB. The second coupling portion 5 is connected to the second portion 2 and the ground. The third coupling portion 6 is connected to the first portion 1 and the ground. The fourth coupling portion 7 is connected to the third portion 3 and the ground.

The first coupling portion 4 and the third coupling portion 6 are micro-strips symmetrical to the first portion 1. The second coupling portion 5 and the fourth coupling portion 7 are micro-strips symmetrically connected to two terminals of the resistor R.

In at least one embodiment, the first coupling portion 4, the second coupling portion 5, the third coupling portion 6 and the fourth coupling portion 7 are U-shaped. Thus, each of the first coupling portion 4, the second coupling portion 5, the third coupling portion 6 and the fourth coupling portion 7 has an opening. An opening direction of the first coupling portion 4 is opposite to an opening direction of the third coupling portion 6. An opening direction of the second coupling portion 5 is opposite to an opening direction of the fourth coupling portion 7.

In at least one embodiment, the power processing circuit 10 further includes a first transmission portion 8 and a second transmission portion 9.

A first terminal of the first transmission portion 8 is connected to the first portion 1. A second terminal of the first transmission portion 8 is connected to the second portion 2. The first transmission portion 8 is configured to match impedance of the first portion 1 and the second portion 2.

A first terminal of the second transmission portion 9 is connected to the first portion 1. A second terminal of the second transmission portion 9 is connected to the third portion 3. The second transmission portion 9 is configured to match impedance of the first portion 1 and the third portion 3.

In at least one embodiment, the first transmission portion 8 and the second transmission portion 9 are U-shaped micro-strip. In some embodiments, they can be another shape, such as arc-shaped, M-shaped, cone-shaped, etc.

For example, a center frequency of a working signal in the power processing circuit 10 is $f_0$. Each length of the first transmission portion 8 and the second transmission portion 9 should be one quarter wavelength of the working signal corresponding to the center frequency $f_0$. In at least one embodiment, the center frequency $f_0$ can be 5.5 gigahertz.

Figure 2:
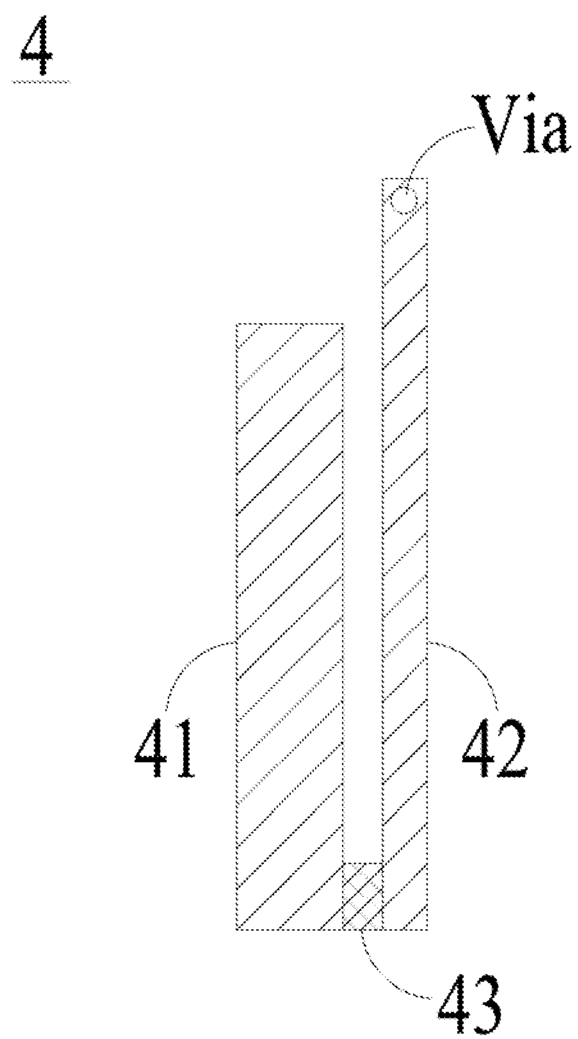
FIG. 2 is a diagrammatic view of a first coupling portion in FIG. 1.

FIG. 2 is a diagrammatic view of the first coupling portion 4 in FIG. 1.

The first coupling portion 4 and the third coupling portion 6 are both micro-strips symmetrical to the first portion 1.

In at least embodiment, each of the first coupling portion 4 and the third coupling portion 6 comprises a first micro-strip 41, a second micro-strip 42 and a connection portion 43. A first terminal of the connection portion 43 is connected to a first terminal of the first micro-strip 41. A second terminal of the connection portion 43 is connected to a first terminal of the second micro-strip 42. A second terminal of the second micro-strip 42 is connected to the ground through a via.

The first portion 1 is connected to the first terminals of the second micro-strips 42 of the first coupling portion 4 and the third coupling portion 6.

In at least one embodiment, a width of the first micro-strip 41 is wider than a width of the second micro-strip 42 in the first coupling portion 4 or the third coupling portion 6. A length of the first micro-strip 41 is shorter than a length of the second micro-strip 42 in the first coupling portion 4 or the third coupling portion 6.

Figure 3:
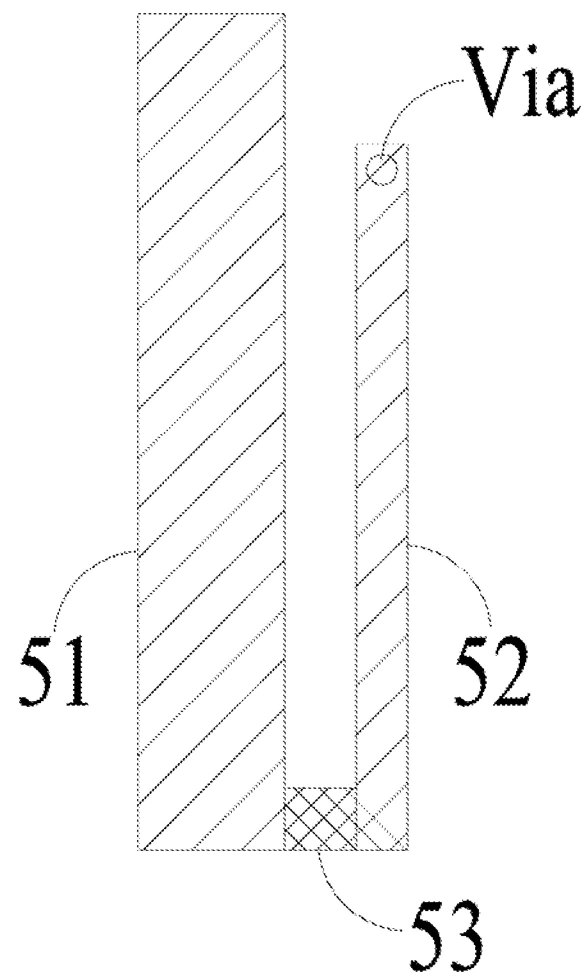
FIG. 3 is a diagrammatic view of a second coupling portion in FIG. 1.

FIG. 3 is a diagrammatic view of the second coupling portion 5 in FIG. 1.

The second coupling portion 5 and the fourth coupling portion 7 are micro-strips symmetrically connected to two terminals of the resistor R.

In at least embodiment, each of the second coupling portion 5 and the fourth coupling portion 7 comprises a first micro-strip 51, a second micro-strip 52 and a connection portion 53. A first terminal of the connection portion 53 is connected to a first terminal of the first micro-strip 51. A second terminal of the connection portion 53 is connected to a first terminal of the second micro-strip 52. A second terminal of the second micro-strip 52 is connected to the ground through a via.

The second portion 2 is connected to the first terminal of the first micro-strip 51 of the second coupling portion 5. The third portion 3 is connected to the first terminal of the first micro-strip 51 of the fourth coupling portion 7.

In at least one embodiment, a width of the first micro-strip 51 is wider than a width of the second micro-strip 52 in the second coupling portion 5 or the fourth coupling portion 7. A length of the first micro-strip 51 is longer than a length of the second micro-strip 52 in the second coupling portion 5 or the fourth coupling portion 7. Each length of the first micro-strips 51 of the second coupling portion 5 and the fourth coupling portion 7 is an eighth of wavelength of the working signal corresponding to the center frequency $f_0$. Thus, second harmonics are suppressed during transmission of power signals.

Figure 4:
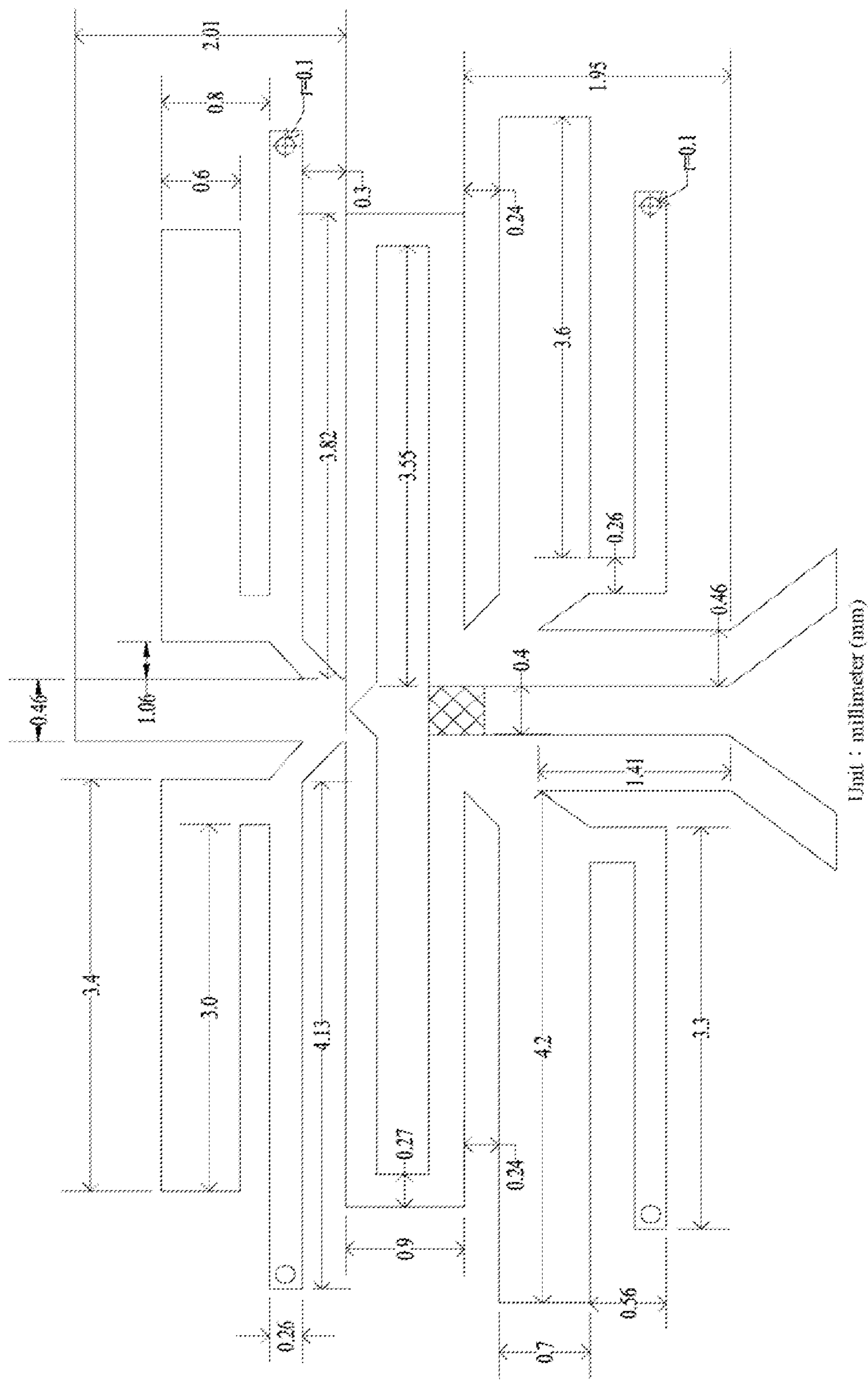
FIG. 4 is a diagram of one embodiment of a power processing circuit.

FIG. 4 is a diagram of one embodiment of a power processing circuit 10.

Figure 5:
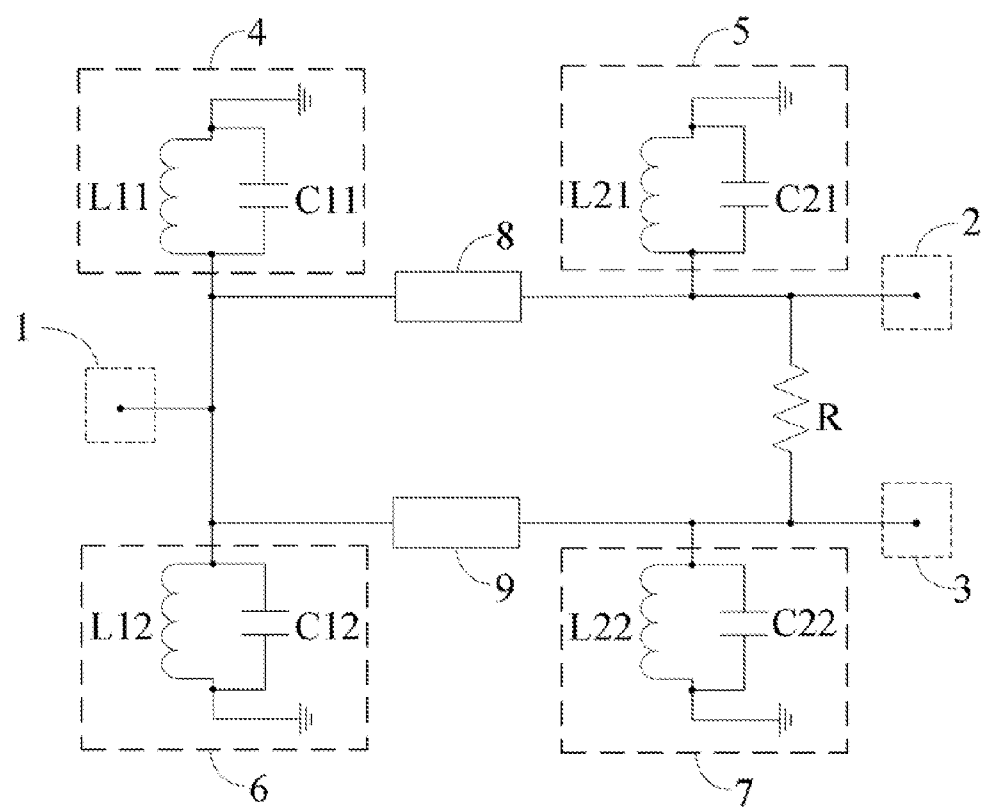
FIG. 5 is an equivalent circuit of the power processing circuit in FIG. 1.

FIG. 5 is an equivalent circuit of the power processing circuit 10 in FIG. 1.

The first coupling portion 4 is equivalent to a first inductor L11 and a first capacitor C11 connected in parallel. The third coupling portion 6 is equivalent to a second inductor L12 and a second capacitor C12 connected in parallel. The second coupling portion 5 is equivalent to a third inductor L21 and a third capacitor C21 connected in parallel. The fourth coupling portion 7 is equivalent to a fourth inductor L22 and a fourth capacitor C22 connected in parallel.

The first micro-strips 41 of the first coupling portion 4 and the third coupling portion 6 are respectively equivalent to the first inductor L11 and the second inductor L12. The second micro-strips 42 of the first coupling portion 4 and the third coupling portion 6 are respectively equivalent to the first capacitor C11 and the second capacitor C12.

The first micro-strips 51 of the second coupling portion 5 and the fourth coupling portion 7 are respectively equivalent to the third inductor L21 and the fourth inductor L22. The second micro-strips 52 of the second coupling portion 5 and the fourth coupling portion 7 are respectively equivalent to the third capacitor C21 and the fourth capacitor C22.

Parameters S (scattering parameters) are applied to evaluate performance of transmission signals and reflected signals, such as performances of reflection and isolation. Please refer to FIGS. 6-11, performances of reflection and isolation are shown.

Figure 6:
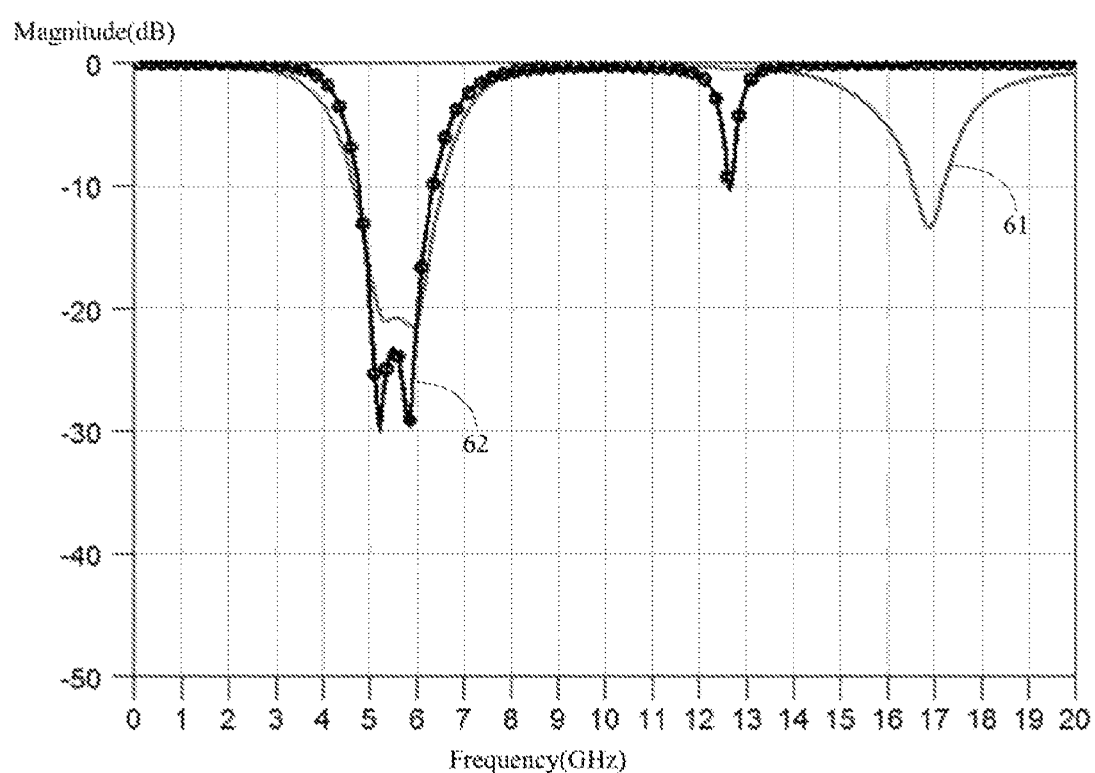
FIG. 6 is a diagram showing characteristics of reflection coefficient of the first portion.

FIG. 6 is a diagram showing characteristics of reflection coefficient $S_{11}$ of the first portion 1. Curve 61 shows a reflection coefficient $S_{11}$ of the first portion 1 of the power processing circuit 10. Curve 62 shows a reflection coefficient $S_{11}$ of the first portion 1 of the equivalent circuit corresponding to the power processing circuit 10.

Figure 7:
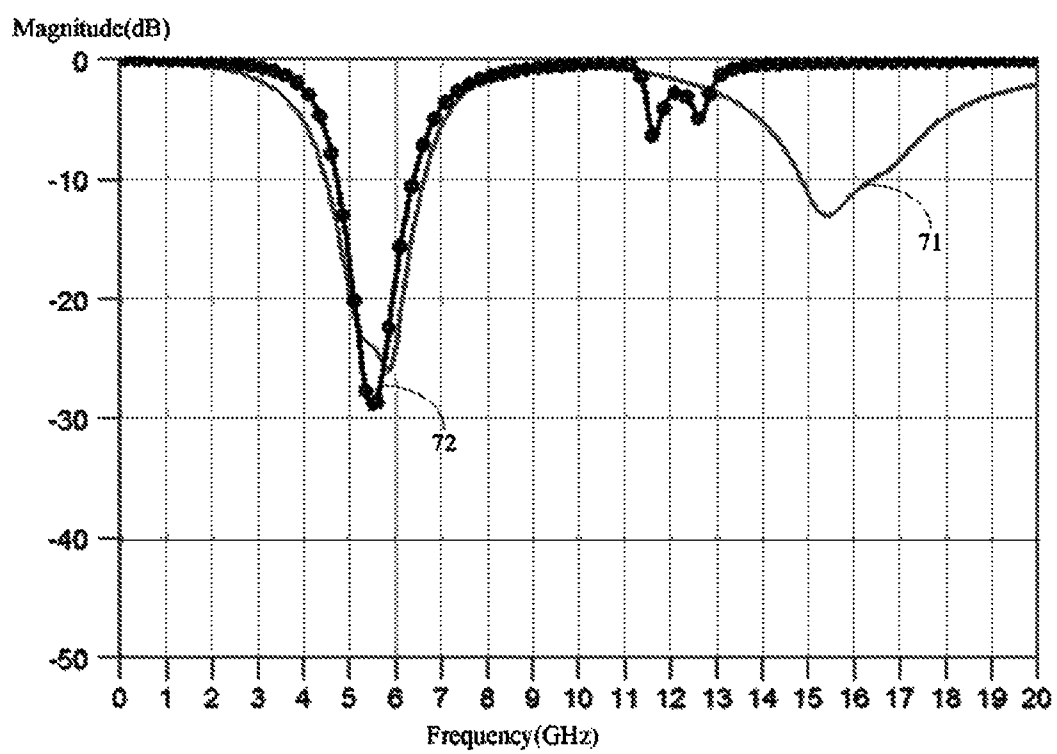
FIG. 7 is a diagram showing characteristics of reflection coefficient of the second portion.

FIG. 7 is a diagram showing characteristics of reflection coefficient $S_{22}$ of the second portion 2. Curve 71 shows a reflection coefficient $S_{22}$ of the second portion 2 of the power processing circuit 10. Curve 72 shows a reflection coefficient $S_{22}$ of the second portion 2 of the equivalent circuit corresponding to the power processing circuit 10.

Figure 8:
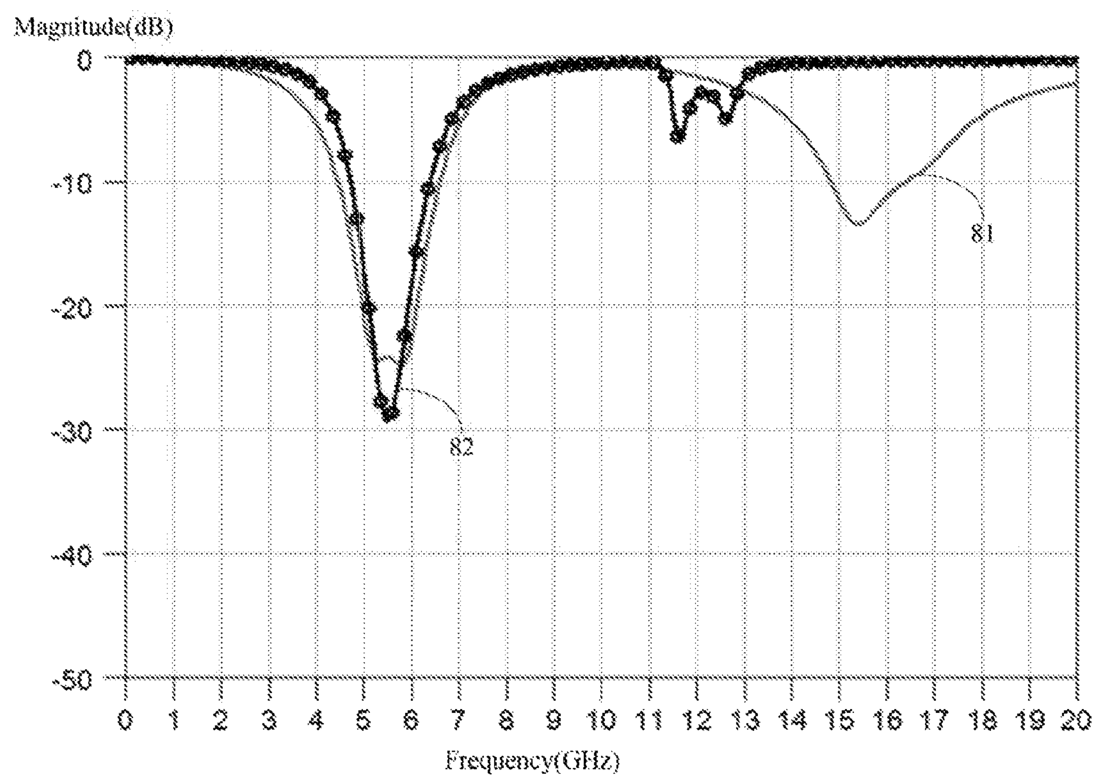
FIG. 8 is a diagram showing characteristics of reflection coefficient of the third portion.

FIG. 8 is a diagram showing characteristics of reflection coefficient $S_{33}$ of the third portion 3. Curve 81 shows a reflection coefficient $S_{33}$ of the third portion 3 of the power processing circuit 10. Curve 82 shows a reflection coefficient $S_{22}$ of the third portion 3 of the equivalent circuit corresponding to the power processing circuit 10.

According to curves in the FIGS. 6-8, when the power processing circuit 10 works in frequencies near 5.5 gigahertz, return loss is less than −20 decibels (dB). The power processing circuit 10 has a good performances of a wide stop band and a low pass filter.

Figure 9:
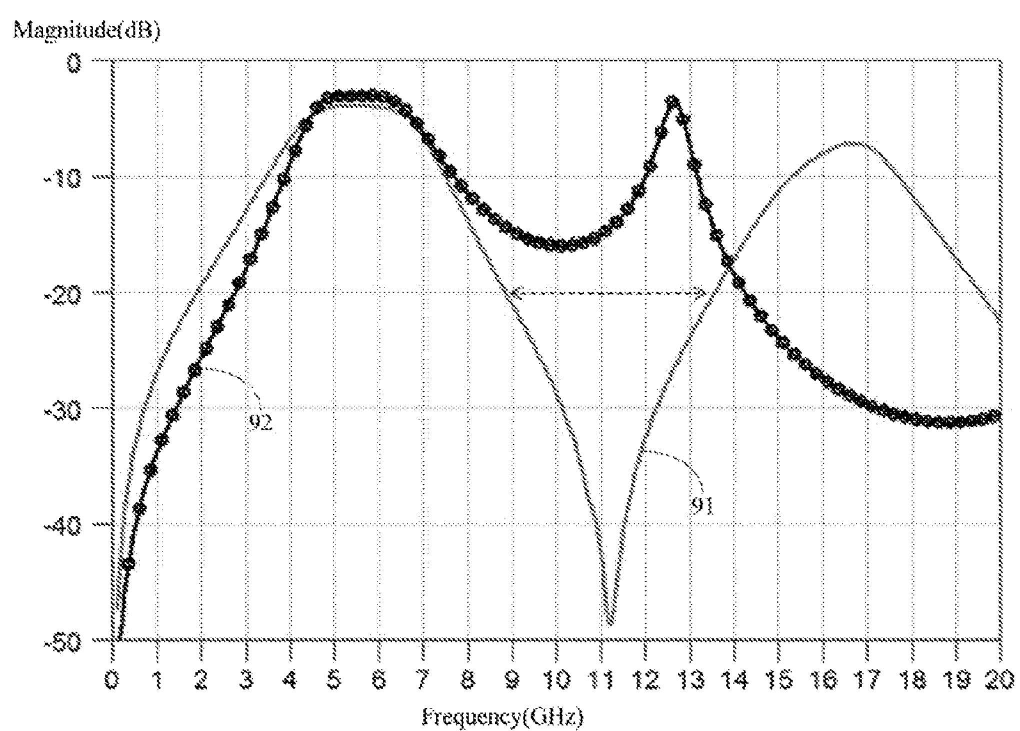
FIG. 9 is a diagram showing characteristics of transmission coefficient from the second portion to the first portion.

FIG. 9 is a diagram showing characteristics of transmission coefficient $S_{21}$ from the second portion 2 to the first portion 1. Curve 91 shows a transmission coefficient $S_{21}$ from the first portion 1 to the second portion 2. Curve 92 shows a transmission coefficient $S_{21}$ of the equivalent circuit from the first portion 1 to the second portion 2.

Figure 10:
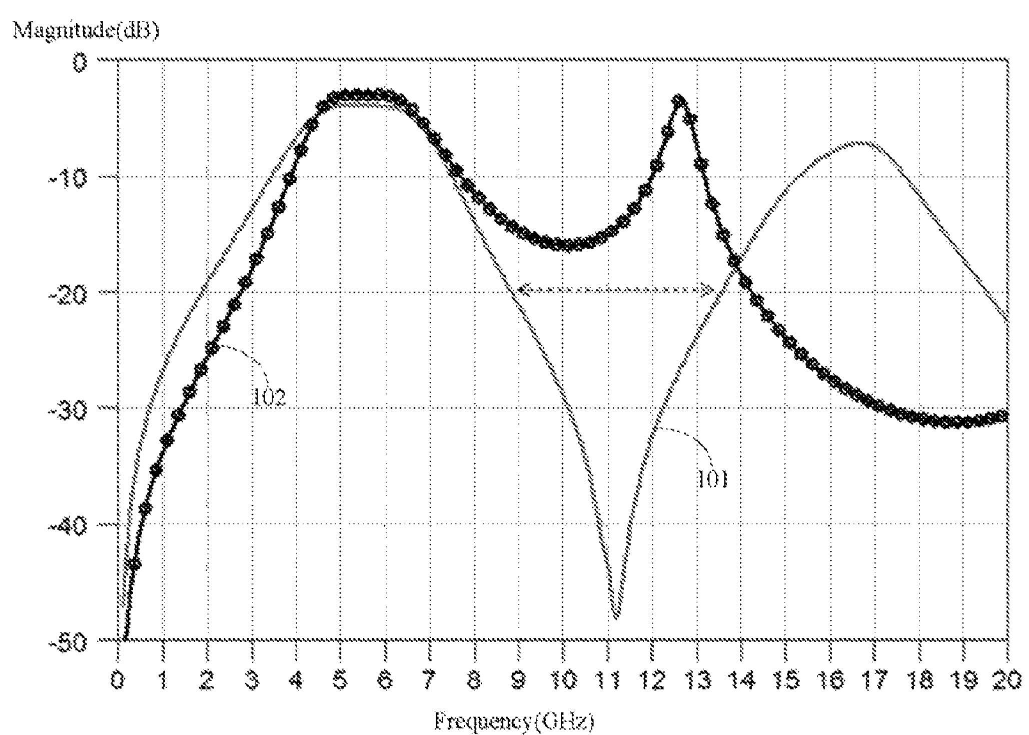
FIG. 10 is a diagram showing characteristics of transmission coefficient from the third portion to the first portion.

FIG. 10 is a diagram showing characteristics of transmission coefficient $S_{31}$ from the third portion 3 to the first portion 1. Curve 101 shows a transmission coefficient $S_{31}$ from the first portion 1 to the third portion 3. Curve 102 shows a transmission coefficient $S_{31}$ of the equivalent circuit from the first portion 1 to the third portion 3.

Figure 11:
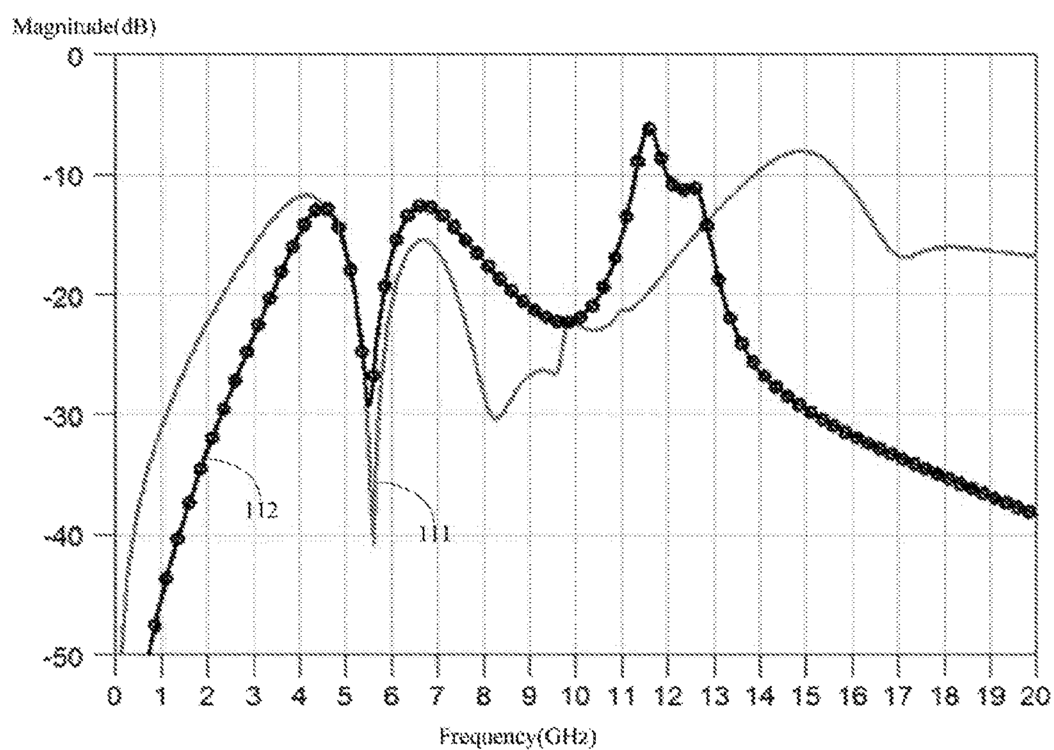
FIG. 11 is a diagram showing characteristics of isolation between the second portion and the third portion.

FIG. 11 is a diagram showing characteristics of isolation $S_{23}$ between the second portion 2 and the third portion 3. Curve 111 shows an isolation $S_{23}$ between the second portion 2 and the third portion 3. Curve 112 shows an isolation $S_{23}$ of the equivalent circuit between the second portion 2 and the third portion 3.

According to curves in the FIGS. 9-11, when the power processing circuit 10 works in frequencies between 8.85 gigahertz and 13.6 gigahertz, return loss is less than −20 dB. The power processing circuit 10 has a good performances to suppress harmonic distortions.

Figure 12:
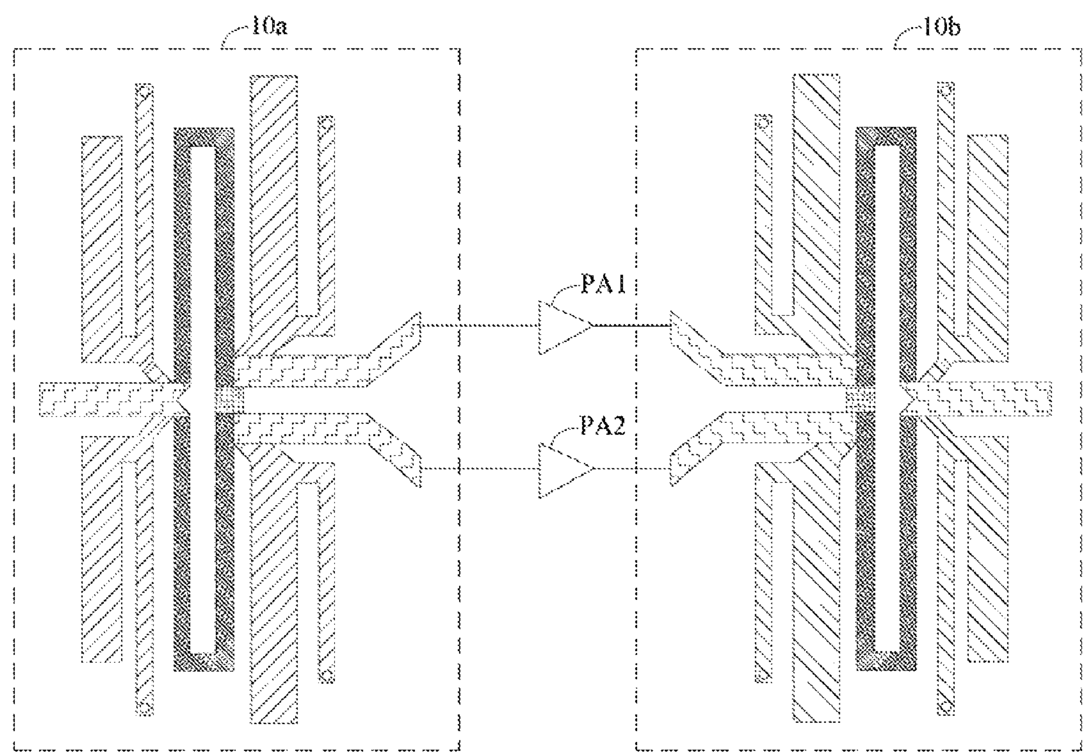
FIG. 12 is a diagrammatic view of one embodiment of a two-path power processing circuit.

FIG. 12 is a diagrammatic view of one embodiment of a two-path power processing circuit.

The power processing circuit includes a power processing circuit 10*a*, a power processing circuit 10*a* and two amplifiers PA1 and PA2. The power processing circuit 10*a* and the power processing circuit 10*b* are the same structure with the power processing circuit 10. The power processing circuit 10*a* is configured to distribute powers. The power processing circuit 10*b* is configured to combine powers.

A second portion 2 of the power processing circuit 10*a* is connected to a second portion 2 of the power processing circuit 10*b* through the amplifier PA1. A third portion 3 of the power processing circuit 10*a* is connected to a third portion 3 of the power processing circuit 10*b* through the amplifier PA2. When powers input from the first portion 1 of the power processing circuit 10*a*, powers is amplified by the amplifiers PA1 and PA2 in the two paths. Then the first portion 1 of the power processing circuit 10*b* outputs powers.

Figure 13:
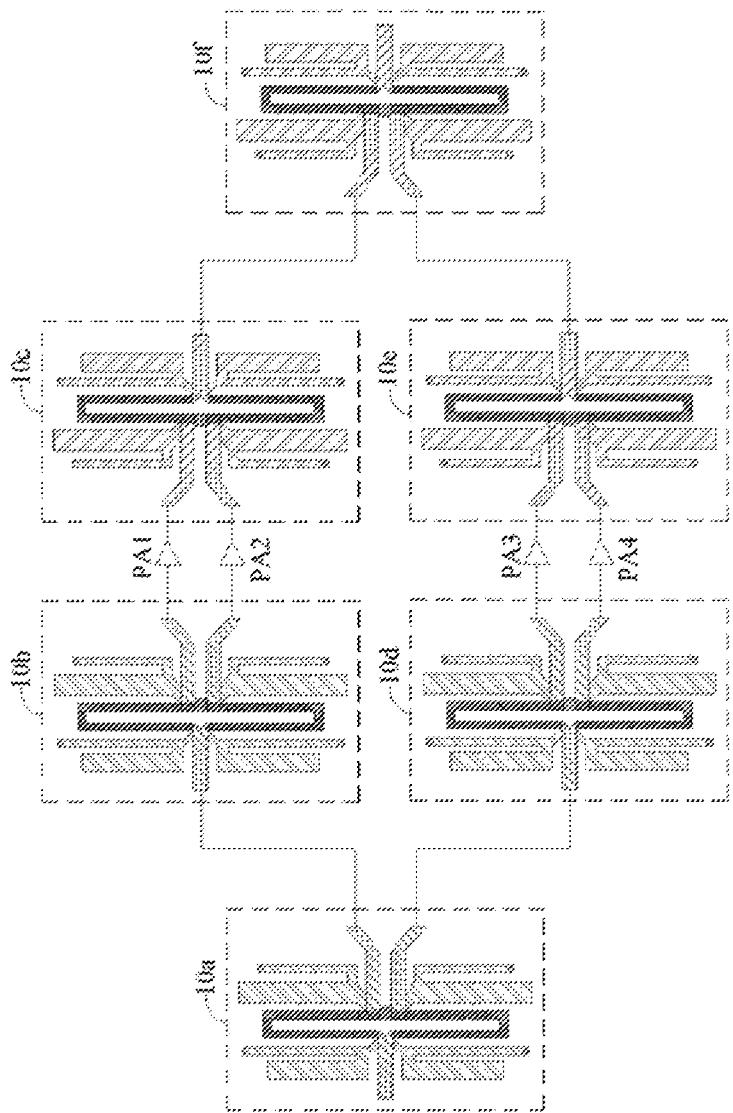
FIG. 13 is a diagrammatic view of one embodiment of a multiplex power processing circuit.

FIG. 13 is a diagrammatic view of one embodiment of a multiplex power processing circuit. In at least one embodiment, a plurality of amplifiers and a plurality of power processing circuits 10 as shown above can be connected as the multiplex power processing circuit in FIG. 13.

A second portion 2 and of a first power processing circuit 10*a* is connected to a first portion 1 and of a second power processing circuit 10*b*. A third portion 3 of the first power processing circuit 10*a* is connected to a first portion 1 of a third power processing circuit 10*d*. A second portion 2 of a fourth power processing circuit 10*f* is connected to a first portion 1 and of a fifth power processing circuit 10*c*. A third portion 3 of the fourth power processing circuit 10*f* is connected to a first portion 1 and of a sixth power processing circuit 10*e*. The second power processing circuit 10*b* is connected to the fifth power processing circuit 10*c* through two amplifiers PA1 and PA2. The third power processing circuit 10*d* is connected to the sixth power processing circuit 10*e* through another two amplifiers PA3 and PA4.

Many details are often found in the art such as the other features of power processing circuits. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A power processing circuit comprising:

a first portion;

a first coupling portion coupled to the first portion and a ground, the first coupling portion being micro-strips symmetrical to the first portion;

a second portion, coupled to the first portion;

a second coupling portion coupled to the second portion and the ground;

a third portion, coupled to the first portion;

a third coupling portion coupled to the first portion and the ground, the third coupling portion being micro-strips symmetrical to the first portion;

a fourth coupling portion coupled to the third portion and the ground; and a resistor coupled between the second portion and the third portion to isolate signals between the second portion and the third portion for decreasing signal interferences between the second portion and the third portion;

wherein the second coupling portion and the fourth coupling portion are micro-strips symmetrically coupled to two terminals of the resistor.

2. The power processing circuit as claimed in claim 1, when the power processing circuit is distributing powers, the first portion is a first signal input terminal, the second portion is a first signal output terminal, the third portion is a second signal output terminal; when the power processing circuit is combining powers, the first portion is a third signal output terminal, the second portion is a second signal input terminal, the third portion is a third signal input terminal.

3. The power processing circuit as claimed in claim 1, further comprising:

a first transmission portion having a first terminal coupled to the first portion, a second terminal coupled to the second portion, configured to match impedance of the first portion and the second portion; and a second transmission portion having a first terminal coupled to the first portion, a second terminal coupled to the third portion, configured to match impedance of the first portion and the third portion.

4. The power processing circuit as claimed in claim 3, wherein the first transmission portion and the second transmission portion are symmetrical to the first portion.

5. The power processing circuit as claimed in claim 3, wherein each length of the first transmission portion and the second transmission portion is one quarter wavelength of a working signal.

6. The power processing circuit as claimed in claim 3, wherein the first coupling portion, the second coupling portion, the third coupling portion, the fourth coupling portion, the first transmission portion and the second transmission portion are U-shaped.

7. The power processing circuit as claimed in claim 1, wherein each of the first coupling portion, the second coupling portion, the third coupling portion and the fourth coupling portion comprises a first micro-strip, a second micro-strip and a connection portion; a first terminal of the connection portion is coupled to a first terminal of the first micro-strip, a second terminal of the connection portion is coupled to a first terminal of the second micro-strip, a second terminal of the second micro-strip is coupled to the ground.

8. The power processing circuit as claimed in claim 7, wherein the first portion is coupled to the first terminals of the second micro-strips of the first coupling portion and the third coupling portion; the second portion is coupled to the first terminal of the first micro-strip of the second coupling portion; and the third portion is coupled to the first terminal of the first micro-strip of the fourth coupling portion.

9. The power processing circuit as claimed in claim 7, wherein a width of the first micro-strip is wider than a width of the second micro-strip in the first coupling portion, a length of the first micro-strip is shorter than a length of the second micro-strip in the first coupling portion; and a width of the first micro-strip is wider than a width of the second micro-strip in the second coupling portion, a length of the first micro-strip is longer than a length of the second micro-strip in the second coupling portion.

10. The power processing circuit as claimed in claim 7, wherein each length of the first micro-strips of the second coupling portion and the fourth coupling portion is an eighth of wavelength of a working signal.

11. A two-path power processing circuit comprising a first amplifier, a second amplifier, a first power processing circuit and a second power processing circuit;

wherein each power processing circuit comprises:

a first portion;

a first coupling portion coupled to the first portion and a ground, the first coupling portion being micro-strips symmetrical to the first portion;

a second portion, coupled to the first portion;

a second coupling portion coupled to the second portion and the ground;

a third portion, coupled to the first portion;

a third coupling portion coupled to the first portion and the ground, the third coupling portion being micro-strips symmetrical to the first portion;

a fourth coupling portion coupled to the third portion and the ground; and wherein the second coupling portion and the fourth coupling portion are micro-strips symmetrically coupled to two terminals of the resistor;

wherein the second portion of the first power processing circuit is coupled to an input terminal of the first amplifier, the third portion of the first power processing circuit is coupled to an input terminal of the second amplifier, the second portion of the second power processing circuit is coupled to an output terminal of the first amplifier, the third portion of the second power processing circuit is coupled to an output terminal of the second amplifier.

12. The two-path power processing circuit as claimed in claim 11, each power processing circuit further comprising a resistor coupled between the second portion and the third portion, wherein the resistor is configured to isolate signals between the second portion and the third portion for decreasing signal interferences between the second portion and the third portion.

13. The two-path power processing circuit as claimed in claim 12, each power processing circuit further comprising:

a first transmission portion having a first terminal coupled to the first portion, a second terminal coupled to the second portion, configured to match impedance of the first portion and the second portion; and a second transmission portion having a first terminal coupled to the first portion, a second terminal coupled to the third portion, configured to match impedance of the first portion and the resistor.

14. The two-path power processing circuit as claimed in claim 13, wherein the first transmission portion and the second transmission portion are symmetrical to the first portion.

15. The two-path power processing circuit as claimed in claim 13, wherein the first coupling portion, the second coupling portion, the third coupling portion, the fourth coupling portion, the first transmission portion and the second transmission portion are U-shaped.

16. A multiplex power processing circuit, comprising a plurality of amplifiers and a plurality of power processing circuits;

wherein each power processing circuit comprises:

a first portion;

a second portion, coupled to the first portion;

a third portion, coupled to the first portion;

a first coupling portion coupled to the first portion and a ground;

a second coupling portion coupled to the second portion and the ground;

a third coupling portion coupled to the first portion and the ground; and a fourth coupling portion coupled to the third portion and the ground;

wherein the first coupling portion and the third coupling portion are micro-strips symmetrical to the first portion;

wherein the second portion of a first power processing circuit is coupled to the first portion of a second power processing circuit, the third portion of the first power processing circuit is coupled to the first portion of a third power processing circuit, the second portion of a fourth power processing circuit is coupled to the first portion of a fifth power processing circuit, the third portion of the fourth power processing circuit is coupled to the first portion of a sixth power processing circuit, the second power processing circuit is coupled to the fifth power processing circuit through two amplifiers, the third power processing circuit is coupled to the sixth power processing circuit through another two amplifiers.

17. The multiplex power processing circuit as claimed in claim 16, each power processing circuit further comprising a resistor coupled between the second portion and the third portion, wherein the resistor is configured to isolate signals between the second portion and the third portion for decreasing signal interferences between the second portion and the third portion.

18. The multiplex power processing circuit as claimed in claim 17, the second coupling portion and the fourth coupling portion are micro-strips symmetrically coupled to two terminals of the resistor.

19. The multiplex power processing circuit as claimed in claim 17, each power processing circuit further comprising:

a first transmission portion having a first terminal coupled to the first portion, a second terminal coupled to the second portion, configured to match impedance of the first portion and the second portion; and a second transmission portion having a first terminal coupled to the first portion, a second terminal coupled to the third portion, configured to match impedance of the first portion and the resistor.

20. The multiplex power processing circuit as claimed in claim 16, wherein the first coupling portion, the second coupling portion, the third coupling portion, the fourth coupling portion, the first transmission portion and the second transmission portion are U-shaped.

* * * * *